(12) United States Patent
Aoki (10) Patent No.: US 7,421,767 B2
(45) Date of Patent: Sep. 9, 2008

(54) METHOD FOR MANUFACTURING A PIEZOELECTRIC VIBRATION DEVICE

(75) Inventor: Shinya Aoki, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 284 days.

(21) Appl. No.: 11/428,097

(22) Filed: Jun. 30, 2006

(65) Prior Publication Data

US 2007/0006434 A1 Jan. 11, 2007

(30) Foreign Application Priority Data

Jul. 6, 2005 (JP) ............................. 2005-197081

(51) Int. Cl.
*H04R 17/00* (2006.01)
*H05K 3/36* (2006.01)

(52) U.S. Cl. .................... 29/25.35; 29/847; 29/830; 310/313 R; 310/340; 310/348; 310/365; 333/193

(58) Field of Classification Search ............... 29/25.35, 29/594, 847, 830; 310/313 R, 313 B, 313 C, 310/340, 348, 349, 365, 366; 333/193, 197
See application file for complete search history.

(56) References Cited

U.S. PATENT DOCUMENTS

| 4,639,631 | A | | 1/1987 | Chason et al. | |
|---|---|---|---|---|---|
| 6,972,511 | B2 | * | 12/2005 | Akane et al. | 310/348 |

| 2002/0121337 | A1 | | 9/2002 | Whatmore et al. | |
|---|---|---|---|---|---|
| 2006/0131998 | A1 | * | 6/2006 | Aoki et al. | 310/340 |

FOREIGN PATENT DOCUMENTS

| JP | 57155821 A | * | 9/1982 | ................. 29/25.35 |
|---|---|---|---|---|
| JP | A-08-213874 | | 8/1996 | |
| JP | A 2003-110391 | | 4/2003 | |
| JP | A-2005-125447 | | 5/2005 | |
| WO | WO 02/05425 A1 | | 1/2002 | |

OTHER PUBLICATIONS

Lee et al, "Fabrication of a ZNO Piezoelectric Cantilever with a High-Aspect Ratio Nano Tip", IEEE 6th Annual Conference on Micro Electro Mechanical Systems, Jan. 2003, pp. 72-75.*

* cited by examiner

Primary Examiner—A. Dexter Tugbang
(74) Attorney, Agent, or Firm—Oliff & Berridge, PLC (57) ABSTRACT

Manufacturing a piezoelectric vibration device, includes: forming a bonding electrode on a part of a piezoelectric substrate to which a cover makes contact; forming a part defining a through hole to the cover so that a profile of an edge of an opening of the through hole at a first surface of the cover is positioned inside an outer shape of the taking out electrode in a plan view when the cover and the piezoelectric substrate are overlapped; forming a first glass film on the first surface of the cover; forming a second glass film on the first surface of the cover; bonding the first glass film to the taking out electrode as well as the second glass film to the bonding electrode by generating an electric field; and cutting an electrical coupling between the taking out electrode and the bonding electrode after step (e).

4 Claims, 8 Drawing Sheets

METHOD FOR MANUFACTURING A PIEZOELECTRIC VIBRATION DEVICE

BACKGROUND

1. Technical Field

The present invention relates to a method for manufacturing a piezoelectric vibration device generating a periodical electric signal by utilizing piezoelectric effect.

2. Related Art

A structure has been known in a surface acoustic wave device, which is one of the piezoelectric vibration devices. In the structure, an anodic bonding part is formed on a piezoelectric substrate having an interdigital transducer (IDT) electrode and a taking out electrode electrically conducted to the IDT electrode so as to surround the taking out electrode and the IDT electrode. A glass plate, which has a through hole formed at a part opposed to the taking out electrode of the piezoelectric substrate, is bonded to the piezoelectric substrate at the anodic bonding part. An external electrode, which goes to the taking out electrode of the piezoelectric substrate through the through hole of the glass plate, is formed by a film forming technique such as spattering. Refer to a first example of related art.

In the example described in the first example of related art, the bonding between a piezoelectric substrate and a glass plate is kept only by an anodic bonding part, while the sealing of a propagation surface, where a surface wave propagates, on the piezoelectric substrate and electrical conduction to the taking out electrode are kept by an external electrode formed on the taking out electrode of the piezoelectric substrate through a through hole of the glass plate. However, cracks or breaks are easily taken place in such external electrode due to stress easily concentrated at the boundary part of the through hole and the taking out electrode. Namely, the example described in the first example of related art has an unsolved problem in that it is difficult to improve reliability of airtight property inside a sealing or reliability of the electrical conduction between the taking out electrode and the external electrode.

A structure that can solve the problem is shown as follows: in a micro electro mechanical system (MEMS) switch in which silicon substrates are anodically bonded with a glass film therebetween, a through hole, in which an electrode electrically conducted to the MEMS switch is provided, is formed at the anodically bonded part; and the peripheral part of the through hole is also anodically bonded. Refer to a second example of related art. In the structure described in the second example of related art, even if an external electrode is formed through the through hole, the stress taken place at the external electrode can be lowered since the peripheral part of the through hole is anodically bonded to the silicon substrate having the MEMS switch.

JP-A-8-213874 is the first example of related art. JP-A-2005-125447 is the second example of related art.

In the example described in the second example of related art, the glass film and the silicon substrate are anodically bonded. For example, in a case where a glass film and quartz serving as a piezoelectric substrate are anodically bonded, it is necessary to insert metal between the quartz and the glass film since the quartz and the glass film cannot be directly anodically bonded. Namely, the anodic bonding is carried out by applying voltage between the glass film and the metal while the glass film and the metal are made contact with each other.

Accordingly, a piezoelectric vibration device having quartz as a piezoelectric substrate has an unsolved problem in that the metal at the anodic bonding part and the taking out electrode are electrically shorted if the structure described in the second example of related art is applied to the piezoelectric vibration device.

SUMMARY

An advantage of the invention is to provide a method for manufacturing a piezoelectric vibration device that can improve reliability of airtight property inside a sealing and electrical conduction between a taking out electrode and an external electrode without an electrical short between the taking out electrode and metal at an anodic bonding part.

A method for manufacturing a piezoelectric vibration device of the invention that includes: (a) forming a bonding electrode on a part of a piezoelectric substrate to which a cover makes contact so that the bonding electrode extends along an outer shape of the piezoelectric substrate and is electrically coupled to a taking out electrode continuously extended from an exciting electrode on the piezoelectric substrate, the piezoelectric substrate generating a vibration based on a driving signal input into the exciting electrode; (b) forming a part defining a through hole to the cover so that a profile of an edge of an opening of the through hole at a first surface of the cover is positioned inside an outer shape of the taking out electrode in a plan view when the cover and the piezoelectric substrate are overlapped so that the first surface covers a part generating the vibration of the piezoelectric substrate so as to prevent a generation of the vibration from being inhibited by the cover and a relative position of the cover and the piezoelectric substrate is aligned; (c) forming a first glass film on the first surface of the cover so that the first glass film surrounds an entire circumference of the edge of the opening of the through hole at the first surface and an entire circumference of an inner circumference of the first glass film makes contact with the taking out electrode when the relative position is aligned; (d) forming a second glass film on the first surface of the cover so that the second glass film makes contact with the bonding electrode and seals a gap between the cover and the bonding electrode when the relative position is aligned; (e) bonding the first glass film to the taking out electrode as well as the second glass film to the bonding electrode by generating an electric field so that a predetermined potential difference is given between the bonding electrode set as a positive electrode and the first and the second glass films that are set as a negative electrode while a relative position of the piezoelectric substrate on which the bonding electrode is formed and the cover on which the first and the second glass films are formed is aligned; and (f) cutting an electrical coupling between the taking out electrode and the bonding electrode after step (e). Here, the piezoelectric substrate includes a plurality of piezoelectric substrates while the cover includes a plurality of covers.

In the invention, the first glass film, which is formed on the peripheral part of the opening of the through hole at the first surface, can be bonded to the taking out electrode. This makes it possible to manufacture a piezoelectric vibration device that can lowered stress taken place in the external electrode. Additionally, the electrical coupling between the taking electrode and the bonding electrode is cut after step (e). This makes it possible to manufacture a piezoelectric vibration device in which the taking out electrode and the bonding electrode are not shorted.

In this case, the cover may has light transparency, and, in step (f), the electrical coupling between the taking out electrode and the bonding electrode may be cut by an irradiation of laser light through the cover.

As a result, the electrical coupling between the taking out electrode and the bonding electrode can be cut.

In this case, in step (a), a narrowed width part having a width narrower than a width of the taking out electrode may be formed, in a plan view, between the taking out electrode and the bonding electrode so as to electrically couples the bonding electrode with the taking out electrode, and in step (f), the electrical coupling may be cut by cutting the narrowed width part by the irradiation of laser light to the narrowed width part.

In the method, the electrical coupling between the taking out electrode and the bonding electrode are cut by the irradiation of laser light to the narrowed width part between the taking out electrode and the bonding electrode. This allows the time taken for cutting to be shortened compared to a case where a part having a width wider than that of the narrowed width part is cut. As a result, cutting can be carried out efficiently.

The invention may further includes: forming the exciting electrode, the taking out electrode, and the bonding electrode in a plurality of numbers in a lump sum on a piezoelectric wafer having an area larger than an area of the piezoelectric substrate in a plan view so that each taking out electrode and each bonding electrode are electrically coupled, and each exciting electrode, each taking out electrode, and each bonding electrode correspond to each of the plurality of piezoelectric substrates; forming the first and second glass films in a plurality of numbers in a lump sum on a cover wafer having an area larger than an area of the cover in a plan view so that each first glass film and each second glass film correspond to each of the plurality of covers; and forming the through hole in a plurality of numbers on the cover wafer on which each first glass film and each second glass film are formed so that each through hole corresponds to each of the plurality of covers. In step (e), the piezoelectric wafer on which the exciting electrode, the taking out electrode, and the bonding electrode are formed and the cover wafer on which the through hole is formed are overlapped so that a relative position of each of the plurality of piezoelectric substrates and each of the plurality of covers are aligned, and each first glass film and each second glass film that are formed on the cover wafer and each taking out electrode and each bonding electrode that are formed on the piezoelectric wafer are bonded respectively in a lump sum, in step (f), the electrical coupling between the taking electrode and the bonding electrode is cut in each of the plurality of piezoelectric substrates after step (e), and after step (f), an external electrode that is electrically coupled to the taking out electrode and extended to a second surface opposite the first surface of the cover from the taking out electrode through the through hole, is formed in a plurality of numbers in a lump sum on the cover wafer, and the cover wafer and the piezoelectric wafer are divided at every piezoelectric substrate.

In the method, the piezoelectric wafer and the cover wafer are bonded in a lump sum, and then each electrical coupling between the taking out electrode and the bonding electrode is cut. Then the external electrode is formed in a lump sum, and the bonded wafers are divided at every piezoelectric substrate. On the piezoelectric wafer, the exciting electrode, the taking out electrode and the bonding electrode that correspond to each of the plurality of piezoelectric substrates are formed in a plurality of numbers in a lump sum, while on the cover wafer, the first and the second glass films that corresponds to each of the plurality of covers are formed in a plurality of numbers in a lump sum. Namely, a plurality of piezoelectric vibration devices is manufactured in a lump sum on a per-wafer basis. This allows the piezoelectric vibration device to be manufactured efficiently compared to a case where each piezoelectric vibration device is individually manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention will be described on a surface acoustic wave device, which is one of piezoelectric devices, as an example with reference to the drawings.

Figure 1:
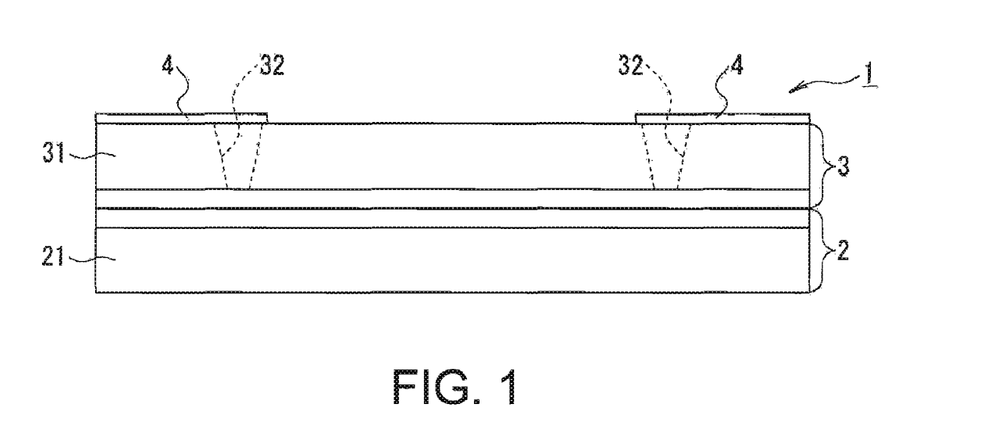
FIG. 1 is a front view illustrating a surface acoustic wave device according to an embodiment of the invention.

A surface acoustic wave device 1 according to the embodiment of the invention includes a surface acoustic wave element 2 generating a surface acoustic wave, a cover 3 sealing a surface wave propagation part of the surface acoustic wave element 2, and an external electrode 4 formed on the upper surface of the cover 3, as shown in FIG. 1, which is a plan view.

The surface acoustic wave element 2 includes an element substrate 21 made of quartz as shown in FIG. 1. Formed on the upper surface of the element substrate 21 are various electrodes that will be described later.

The cover 3, which is made of quartz having light transparency as shown in FIG. 1, includes a cover substrate 31 to which a through hole 32 is formed. The opening of the through hole 32 reduces its size from the upper side to the lower side as viewed in FIG. 1. On the lower surface as viewed in FIG. 1 of the cover substrate 31, various glass films, which will be described later, are formed.

The external electrode 4 is formed, as shown in FIG. 1, so as to cover the through hole 32 of the cover substrate 31 from the upper side as viewed in FIG. 1.

Then, the above-described structure will be described in detail.

Figure 2:
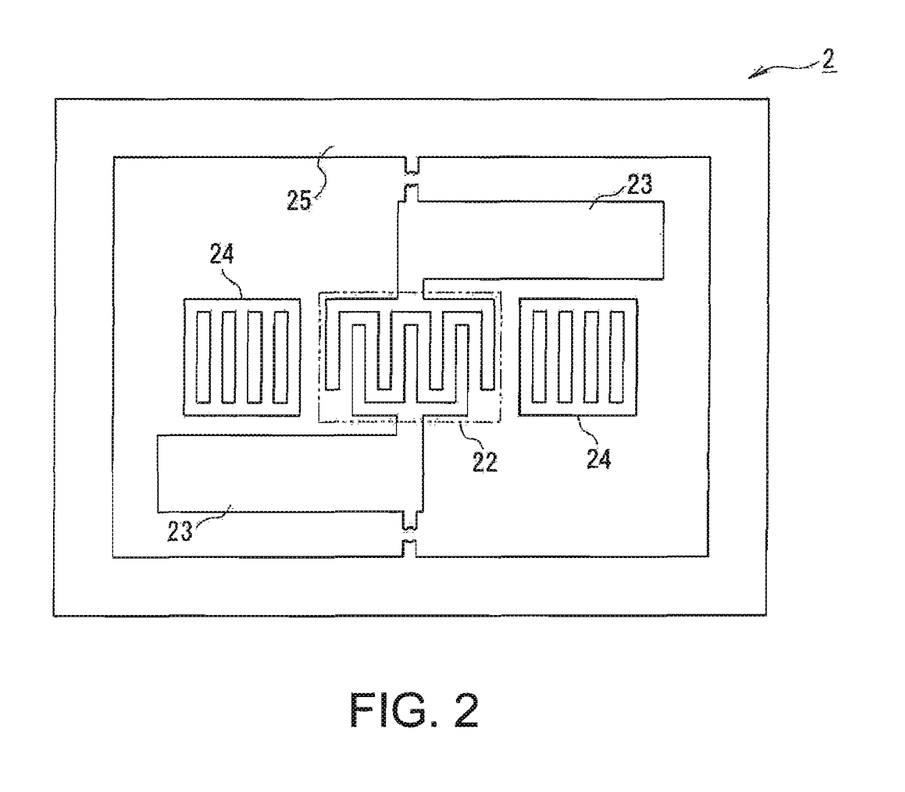
FIG. 2 is a plan view illustrating a surface acoustic wave element of the surface acoustic wave device according to the embodiment of the invention.

The surface acoustic wave element 2 includes an IDT electrode 22, a taking out electrode 23, a reflector electrode 24, and a bonding electrode 25, as shown in FIG. 2, which is a plan view. The IDT electrode 22 excites a surface acoustic wave in the surface acoustic wave element 2 when driving voltage is applied. The taking out electrode 23 is electrically connected to the IDT electrode 22 as an extension of the IDT electrode 22. The reflector electrode 24 is formed at both sides of the IDT electrode 22 so as to reflect the surface acoustic wave excited by the IDT electrode 22. The bonding electrode 25 is formed along the entire circumference of the outer edge of the element substrate 21 so as to be inside the outer shape of the element substrate 21.

Figure 3A:
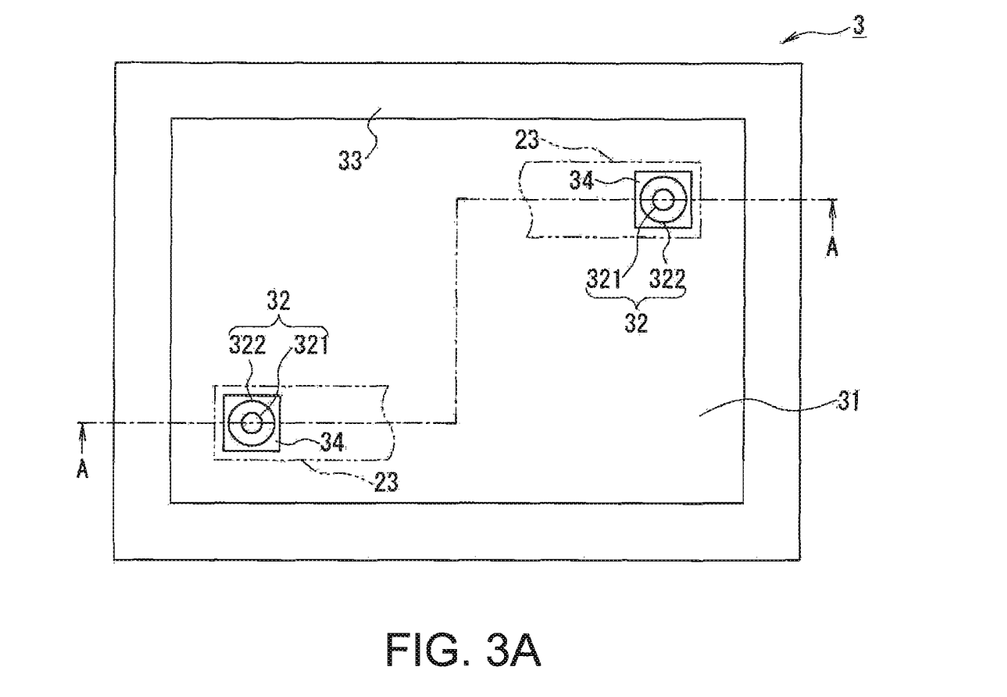
FIGS. 3A and 3B are views explaining a structure of a cover of the surface acoustic wave device according to the embodiment of the invention.

In the cover 3, each through hole 32 is formed at a position, which is correspondingly opposed to each taking out electrode 23, of the cover substrate 31 as shown in FIG. 3A, which is a plan view.

Figure 3B:
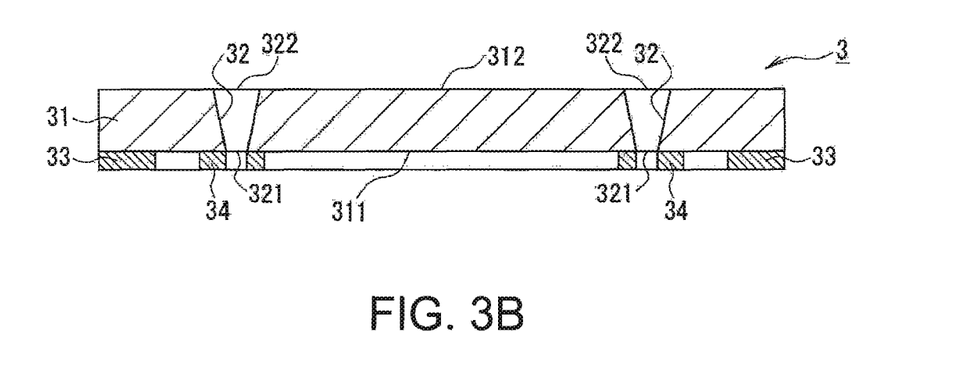

The cover substrate 31 includes a first surface 311 and a second surface 312 as shown in FIG. 3B, which is a cross-sectional view taken along the line A-A' in FIG. 3A. The first surface 311 is the surface adjacent to the surface acoustic wave element 2, while the second surface 312 is the surface opposite the first surface 311. In FIGS. 3A and 3B, a first opening 321 is the opening of each through hole 32 at the first surface 311, while a second opening 322 is the opening of each through hole 32 at the second surface 312.

The through hole 32 formed in the cover substrate 31 has the following slanted shape as shown in FIG. 3B: the first opening 321 is smaller than the second opening 322 in size, and the cross-section of the through hole 32 are tapered from the second opening 322 to the first opening 321. The through hole 32 is also formed so that the profile of the first opening is positioned inside the outer shape of the taking out electrode 23, as shown in FIG. 3A.

The cover 3 also includes a rim glass film 33 and a through hole glass film 34, as shown in FIG. 3A. The rim glass film 33 is formed along the entire circumference of the outer edge of the cover substrate 31 so as to be inside the outer shape of the cover substrate 31. Each through hole glass film 34 is formed around each through hole 32. The rim glass film 33 and the through hole glass film 34 are formed on the first surface 311 of the cover substrate 31, as shown in FIG. 5B. The through hole glass film 34 is also formed along the entire circumference of the edge of the first opening 321.

Figure 4A:
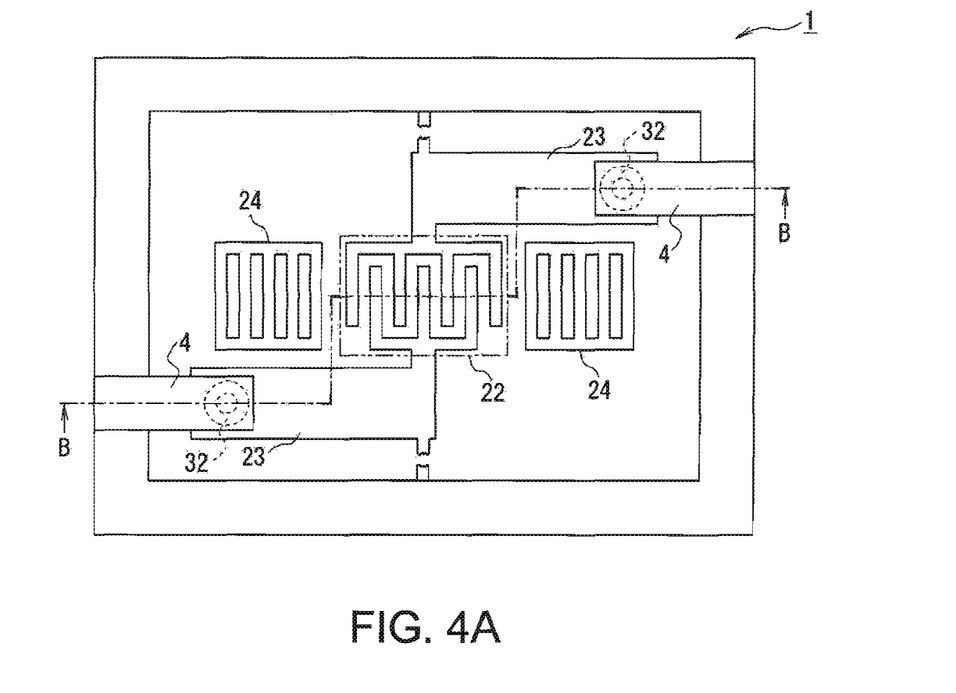
FIGS. 4A and 4B are views explaining a structure of the surface acoustic wave device according to the embodiment of the invention.
Figure 4B:
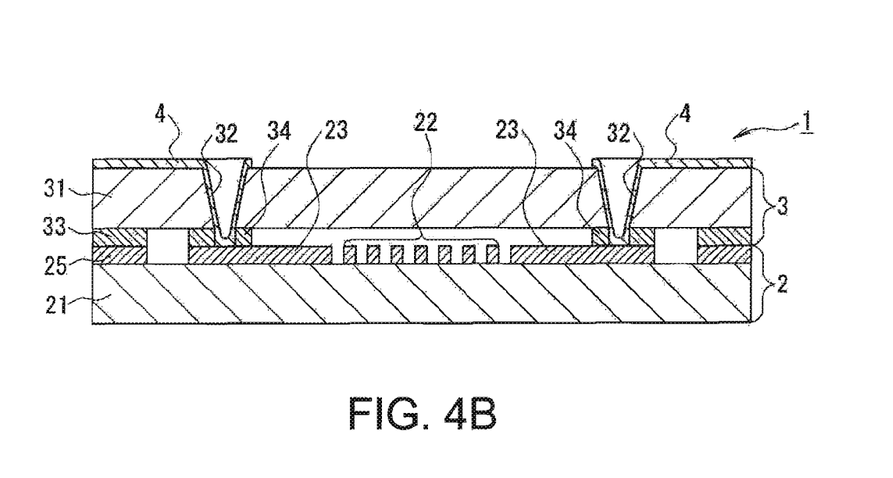

Each external electrode 4 is formed so as to cover each through hole 32 of the cover substrate 31 from the side adjacent to the second surface 312 of the cover substrate 31 as shown in FIG. 4A, which is a plan view of the surface acoustic wave device 1. Each external electrode 4 is connected to each taking out electrode 23 of the surface acoustic wave element 2 through each through hole 32 as shown in FIG. 4B, which is a cross-sectional view taken along the line B-B in FIG. 4A.

In the surface acoustic wave device 1 structured as described above, the surface acoustic wave propagation part of the surface acoustic wave element 2 is sealed with the cover 3. When a driving signal is input to the external electrode 4, the driving signal is transmitted to the IDT electrode 22 through the taking out electrode 23 so as to excite a surface acoustic wave.

Next, a method for manufacturing the surface acoustic wave device 1 of the embodiment will be described. The manufacturing method is broadly classified into the following processes. A process to manufacture an element raw material substrate, which will be described later, serving as a raw material for the surface acoustic wave element 2, a process to manufacture the cover 3, a bonding process to bond the element raw material substrate and the cover 3, a cutting process to cut the electrical connection, which will be described later, between the taking out electrode 23 and the bonding electrode 25, and a process to form the external electrode 4. In this regard, the process to manufacture the element raw material substrate for the surface acoustic wave element 2 and the process to manufacture the cover 3 can be individually and concurrently carried out, so that the order of two processes are not concerned whether either one is firstly carried out or not.

The process to manufacture the element raw material substrate serving as the raw material for the surface acoustic wave element 2 will be described with reference to FIGS. 5A through 5C.

Figure 5A:
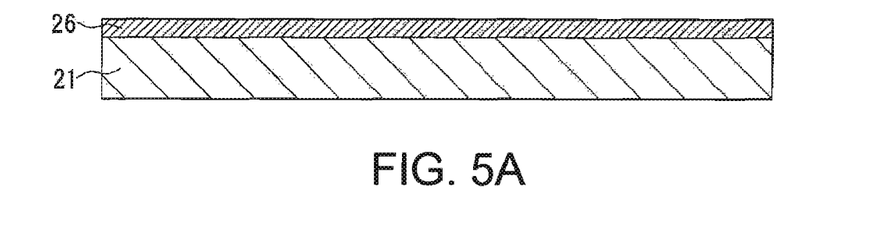
FIGS. 5A, 5B and 5C are views explaining a manufacturing process of an element raw material substrate of the surface acoustic wave device according to the embodiment of the invention.
Figure 5B:
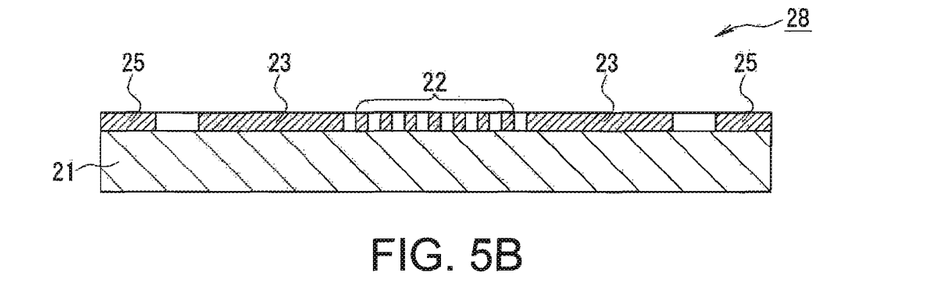
Figure 5C:
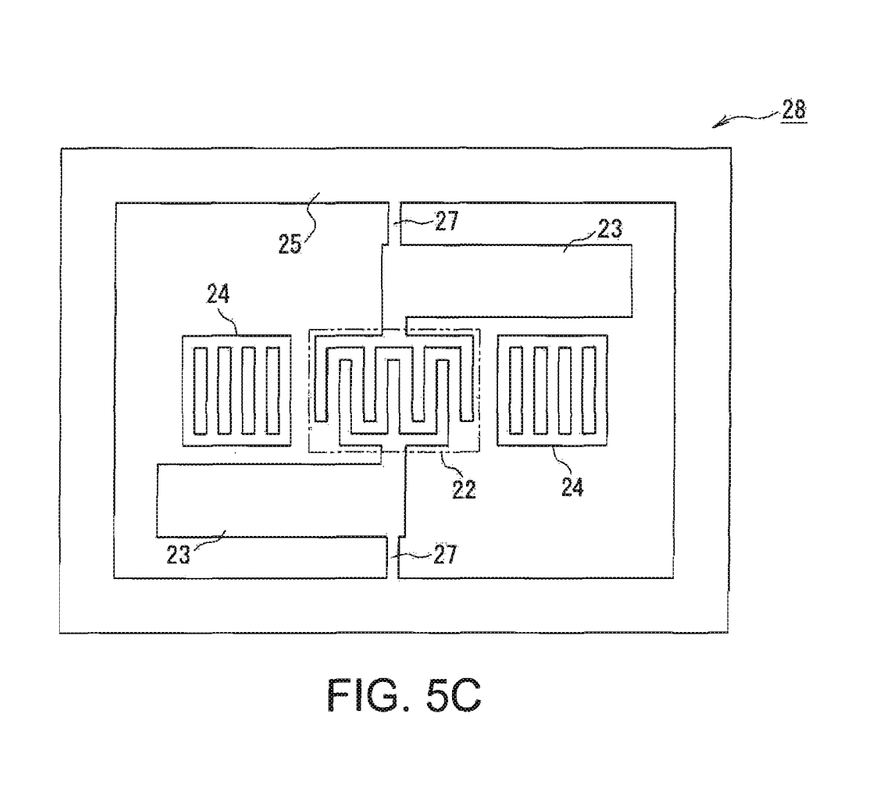

In the process to manufacture the element raw material substrate, first, a metal film 26 mainly made of aluminum is formed on the element substrate 21 by utilizing techniques such as a spattering technique, a vapor deposition technique, a chemical vapor deposition (CVD) as shown in FIG. 5A.

Then, the IDT electrode 22, the taking out electrode 23, the reflector electrode 24 and the bonding electrode 25 are formed so as to achieve the element raw material substrate 28 as shown in FIG. 5B by utilizing, for example, a photolithography technique and an etching technique. In this regard, a connection between electrodes 27 is formed between each taking out electrode 23 and the bonding electrode 25 in the element raw material substrate 28 as shown in FIG. 5C. The connection between electrodes 27 electrically connects each taking out electrode 23 to the bonding electrode 25.

The process to manufacture the cover 3 will be described with reference to FIGS. 6A through 6C.

Figure 6A:
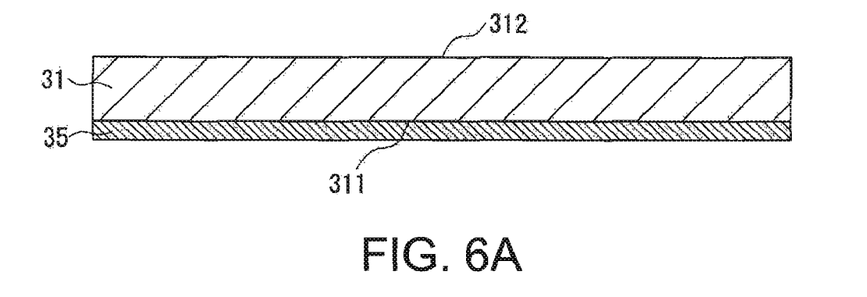
FIGS. 6A, 6B and 6C are views explaining a manufacturing process of the cover of the surface acoustic wave device according to the embodiment of the invention.

In the process to manufacture the cover 3, first, a glass film 35 composed of borosilicate glass is formed on the first surface 311 of the cover substrate 31 as shown in FIG. 6A by utilizing a spatter technique.

Figure 6B:
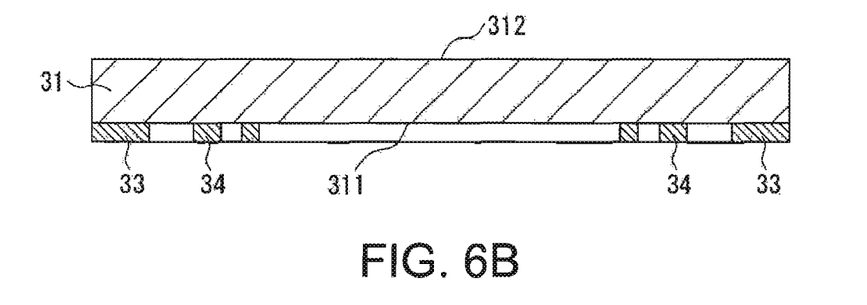
Figure 6C:
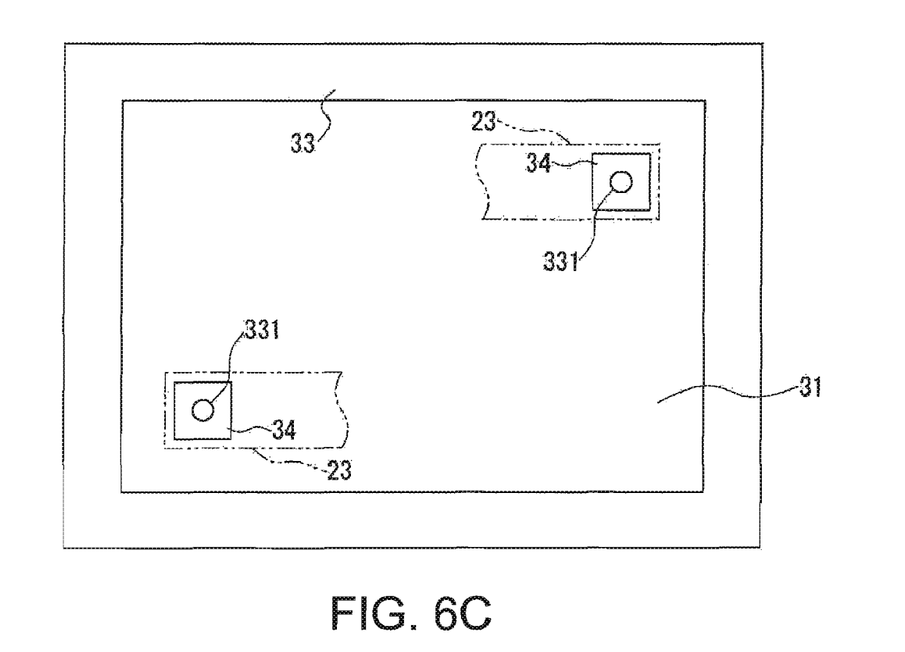

Then, the rim glass film 33 and the through hole glass film 34 are formed as shown in FIG. 6B by utilizing, for example, a photolithography technique and an etching technique. In this regard, the through hole glass film 34 is formed so as to open the part to which the first opening 321 of the through hole 32 is formed, as shown in FIG. 6C, which is a plan view of the cover substrate 31. The through hole glass film 34 is also formed so that the profile of an opening 331 of the through hole glass film 34 is positioned inside the outer shape of the taking out electrode 23. In this regard, the profile of the through hole glass film 34 may be out of the outer shape of the taking out electrode 23.

Then, the through hole 32 is formed to the cover substrate 31 so as to complete the cover 3 shown in FIG. 3 by utilizing, for example, a photolithography technique and an etching technique.

The bonding process to bond the element raw material substrate 28 and the cover 3 will be described with reference to FIGS. 7A and 7B. In the bonding process, first, the first surface 311 of the cover substrate 31 in the cover 3 is faced to the surface, on which the bonding electrode 25 is formed, of the element raw material substrate 28, and then the cover 3 and the element raw material substrate 28 are overlapped.

Figure 7A:
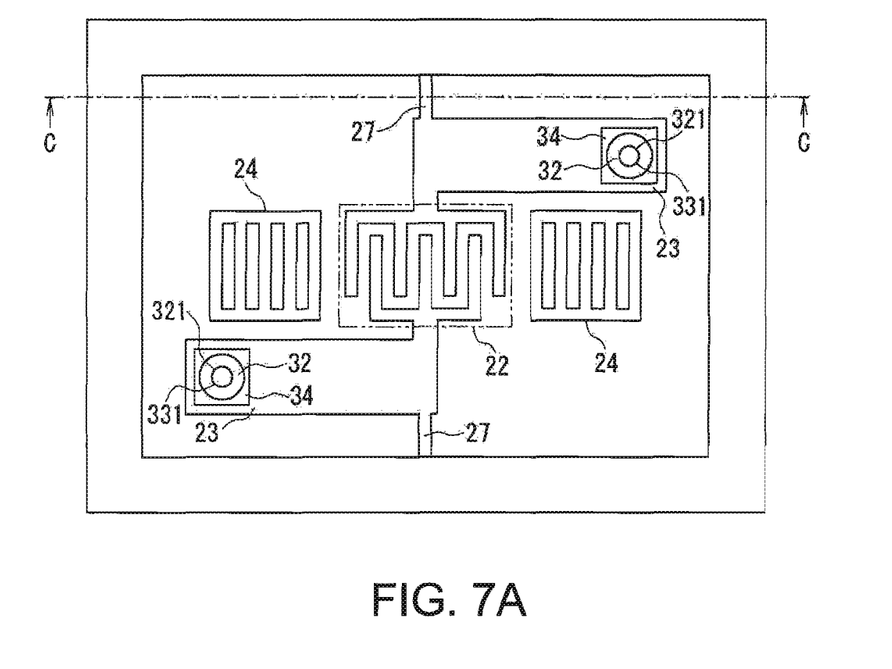
FIGS. 7A and 7B are views explaining a bonding process of the surface acoustic wave device according to the embodiment of the invention.

Next, as shown in FIG. 7A, the cover 3 and the element raw material substrate 28 are relatively aligned in their positions so that the profiles of the first opening 321 of each through hole 32 and the opening 331 of each through hole glass film 34 are positioned inside the outer shape of the taking out electrode 23, and the entire circumference of the rim glass film 33 of the cover 3 and the entire circumference of the bonding electrode 25 of the element raw material substrate 28 are overlapped.

Figure 7B:
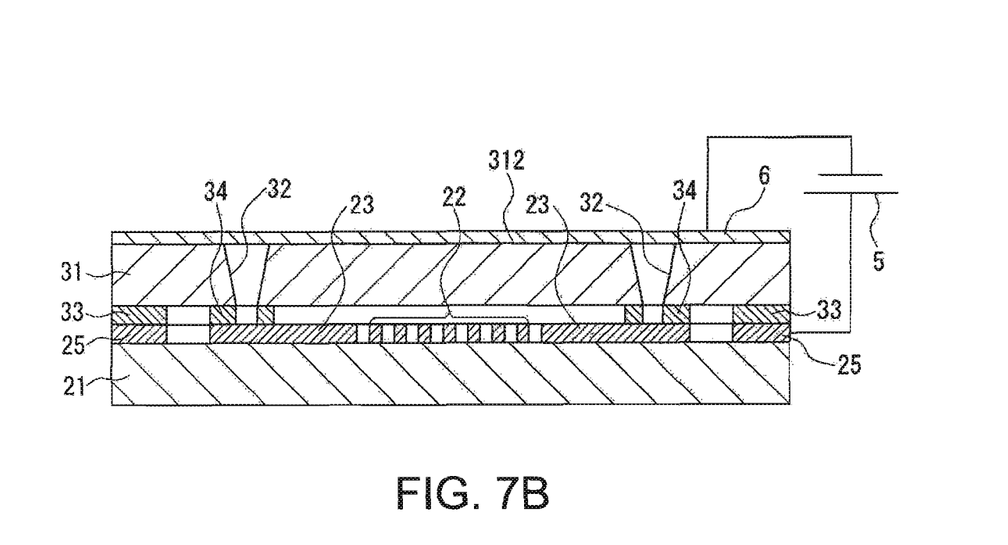

Then, while the cover 3 and the element raw material substrate 28 are relatively aligned, the positive electrode of a direct current power supply source 5 is connected to the bonding electrode 25, and the negative electrode of the direct current power supply source 5 is connected to an electrode plate 6 placed on the second surface 312 of the cover substrate 31, as shown in FIG. 7B.

Subsequently, a voltage of 1 to 1.5 kV is generated in the direct current power supply source 5 so as to anodically bond the through hole glass film 34 and the taking out electrode 23 as well as the rim glass film 33 and the bonding electrode 25.

The cutting process to cut the electrical connection between the taking out electrode 23 and the bonding electrode 25 will be described with reference to FIGS. 8A and 8B.

Figure 8A:
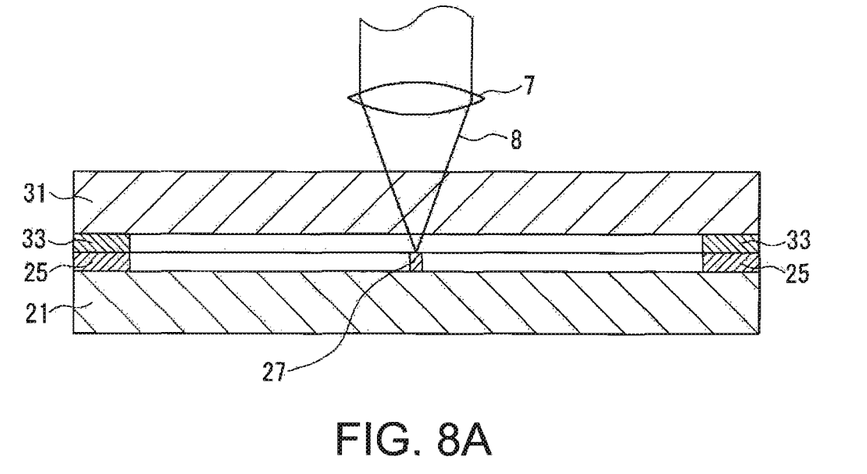
FIGS. 8A and 8B are views explaining a cutting process of the surface acoustic wave device according to the embodiment of the invention.

In the cutting process, the connection between electrodes 27 is irradiated with laser light 8 so as to cut the connection between electrodes 27, as shown in FIG. 8A, which is a cross-sectional view taken along the line C-C' of FIG. 7A. The laser light 8 is, for example, converged through an optical system, which is not shown, including a convex lens 7 and so forth, and transmitted through the cover substrate 31.

Figure 8B:
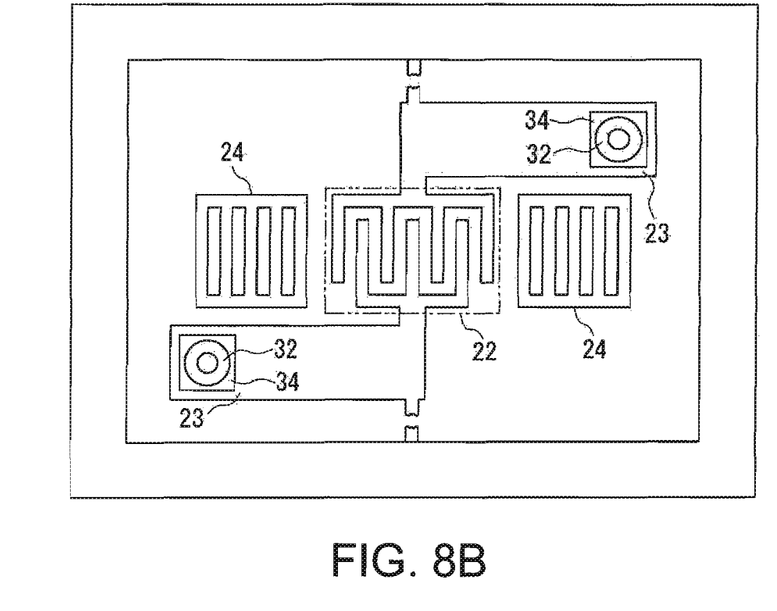

The connection between electrodes 27 is cut by the irradiation of the laser light 8, resulting in the electrical connection between the taking out electrode 23 and the bonding electrode 25 being cut as shown in FIG. 8B.

Here, the laser light 8 is favorable as long as it has a wavelength absorbed in the connection between electrodes 27 and transmits the cover substrate 31. For example, infrared laser such as YAG laser, $CO_2$ laser, $YVO_4$ laser, YLF laser, and ultra violet laser such as ArF excimer laser, Kr Cl excimer laser, and KrF excimer laser can be employed.

In the process to form the external electrode 4, the external electrode 4 shown in FIGS. 4A and 4B is formed by utilizing a photolithography technique, an etching technique, a mask vapor deposition technique, a lift-off processing technique, and the like. As a result, the surface acoustic wave device 1 is completed.

As for the order of the cutting process and the process to form the external electrode 4, the process to form the external electrode 4 may be carried out in first if the external electrode 4 does not intercept the irradiation of laser light 8 to the connection between electrodes 27.

Here, in the embodiment, the surface acoustic wave element 2 corresponds to the piezoelectric substrate, while the connection between electrodes 27 corresponds to the narrowed width part.

In the embodiment, the through hole glass film 34 surrounding the entire circumference of the first opening 321 is formed on the peripheral part of the first opening 321 of the through hole 32, thereby the through hole glass film 34 and the taking out electrode 23 can be bonded. Accordingly, stress taken place in the external electrode 4, which is electrically connected to the taking out electrode 23 through the through hole 32, can be lowered.

Further, the connection between electrodes 27, which is formed between the taken out electrode 23 and the bonding electrode 25 so as to electrically connect the taken out electrode 23 and the bonding electrode 25, is cut after the bonding process, thereby the taken out electrode 23 and the bonding electrode 25 are not electrically shorted.

Consequently, according to the embodiment, the surface acoustic wave device 1 can be provided that can improve reliability of airtight property inside a sealing and reliability of electrical conduction between the taking out electrode 23 and the external electrode 4 without an electrical short between the taking out electrode 23 and the bonding electrode 25.

Further, in the embodiment, the connection between electrodes 27 is formed so as to be narrower than the width of the taking out electrode 23. This allows the time consuming to cut to be shortened compared to a case where the taking out electrode 23 extends to the bonding electrode 25 with the same width so as to electrically connect between the taking out electrode 23 and the bonding electrode 25. As a result, the surface acoustic wave device 1 can be efficiently manufactured.

While a method in which the surface acoustic wave device 1 is individually manufactured is described as an example in the embodiment, but the invention is not limited to this. The surface acoustic wave device 1 may be manufactured by the following manner. The surface acoustic wave device 1 may be formed in a plurality of numbers at once on a per-wafer basis, and then the wafer may be divided into piece by piece as the surface acoustic wave device 1.

Figure 9A:
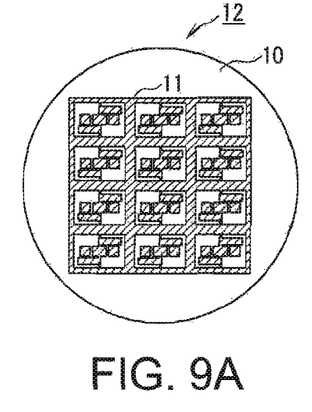
FIGS. 9A through 9F are views explaining another manufacturing process of the surface acoustic wave device according to the embodiment of the invention.

Namely, as shown in FIG. 9A, an element side wafer 12 having an electrode pattern 11 formed on a quartz wafer 10 is manufactured. On the electrode pattern 11, the IDT electrode 22, the taking out electrode 23, the reflector electrode 24, the bonding electrode 25 and the connection between electrodes 27 are formed in a lump sum so as to correspond each of a plurality of surface acoustic wave elements 2.

Figure 9B:
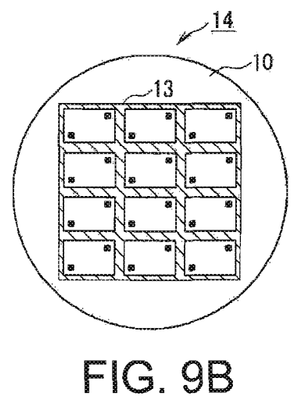

In contrast, as shown in FIG. 9B, a glass film pattern 13 is formed on the quartz wafer 10, which is different from that in the element side wafer 12. On the glass film pattern 13, the rim glass film 33 and the through hole glass film 34 are formed in a lump sum so as to correspond each of a plurality of covers 3. Then, the through hole 32 is formed in a lump sum to the quartz wafer 10, on which the glass film pattern 13 is formed, so as to correspond each cover 3, thereby a cover side wafer 14 is manufactured.

Figure 9C:
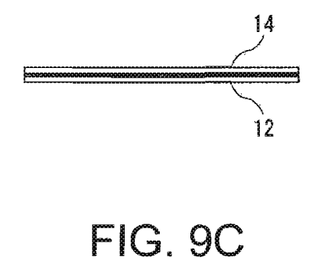

Next, as shown in FIG. 9C, the element side wafer 12 and the cover side wafer 14 are relatively aligned in their positions so that the profiles of the first opening 321 of each through hole 32 and the opening 331 of each through hole glass film 34 are positioned inside the outer shape of each taking out electrode 23, and the entire circumference of each rim glass film 33 corresponding to each cover 3 and the entire circumference of each bonding electrode 25 corresponding to each surface acoustic wave element 2 are overlapped. Then, the electrode pattern 11 and the glass film pattern 13 are anodically bonded while they are relatively aligned.

Figure 9D:
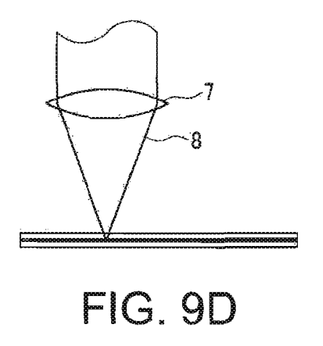

Next, the connection between electrodes 27, which corresponds to each surface acoustic wave element 2, is irradiated with the laser light 8 as shown in FIG. 9D so as to cut the connection between electrodes 27.

Figure 9E:
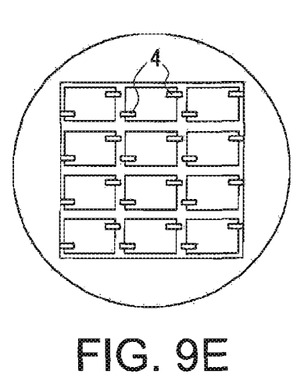

Then, as shown in FIG. 9E, the external electrode 4 is formed on the cover side wafer 14 in a lump sum so as to correspond to each through hole 32.

Figure 9F:
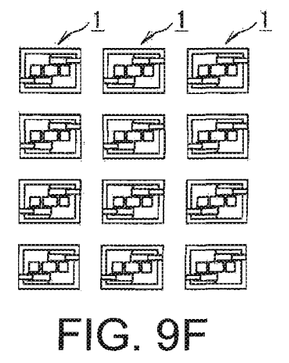

Next, as shown in FIG. 9F, the element side wafer 12 and the cover side wafer 14 are cut at every surface acoustic wave element 2 so as to individually complete the surface acoustic wave device 1.

In this case, the element side wafer 12 corresponds to the piezoelectric substrate, while the cover side wafer 14 corresponds to the cover wafer. As described above, the plurality of surface acoustic wave devices 1 can be manufactured in a lump sum on a per-wafer basis. This allows the surface acoustic wave device 1, which can improve reliability of airtight property inside a sealing and reliability of electrical conduction between the taking out electrode 23 and the external electrode 4 without an electrical short between the taking out electrode 23 and the bonding electrode 25, to be efficiently manufactured compared to a case where each surface acoustic wave device 1 is individually manufactured.

While a case where quartz is used as a piezoelectric substance is described in the embodiment, but the piezoelectric substance is not limited to this. Lithium tantalite, lithium niobate and the like are favorable. Further, a structure may also be favorable in which a piezoelectric thin film is formed on a glass substrate or a silicon substrate.

In addition, while a surface acoustic wave device, which is one of piezoelectric vibration devices, is described as an example in the embodiment, but the invention is not limited to this. A piezoelectric vibration device such as a tuning folk quartz crystal vibration device, and a thickness shear quartz crystal vibration device, also can be applied.

The entire disclosure of Japanese Patent Application No. 2005-197081, filed Jul. 6, 2005 is expressly incorporated by reference herein.

What claimed is:

1. A method for manufacturing a piezoelectric vibration device, comprising:
    (a) forming a bonding electrode on a part of a piezoelectric substrate to which a cover makes contact so that so that the bonding electrode extends along an outer shape of the piezoelectric substrate and is electrically coupled to a taking out electrode continuously extended from an exciting electrode on the piezoelectric substrate, the piezoelectric substrate generating a vibration based on a driving signal input into the exciting electrode;
    (b) forming a part defining a through hole to the cover so that a profile of an edge of an opening of the through hole at a first surface of the cover is positioned inside an outer shape of the taking out electrode in a plan view when the cover and the piezoelectric substrate are overlapped so that the first surface covers a portion of the piezoelectric substrate generating the vibration so as to prevent a generation of the vibration from being inhibited by the cover, and a relative position of the cover and the piezoelectric substrate is aligned;
    (c) forming a first glass film on the first surface of the cover so that the first glass film surrounds an entire circumference of the edge of the opening of the through hole at the first surface and an entire inner circumference of the first glass film makes contact with the taking out electrode when the relative position of the cover is aligned;
    (d) forming a second glass film on the first surface of the cover so that the second glass film makes contact with the bonding electrode and seals a gap between the cover and the bonding electrode when the relative position of the cover is aligned;
    (e) bonding the first glass film to the taking out electrode and bonding the second glass film to the bonding electrode by generating an electric field so that a predetermined potential difference is given between the bonding electrode set as a positive electrode, and the first and the second glass films that are set as a negative electrode while a relative position of the piezoelectric substrate obtained in step(a) and the cover obtained in step (d) is aligned; and
    (f) cutting an electrical coupling between the taking out electrode and the bonding electrode after step (e), wherein the piezoelectric substrate includes a plurality of piezoelectric substrates while the cover includes a plurality of covers.

2. The method for manufacturing a piezoelectric vibration device according to claim 1, wherein, in step (f), the electrical coupling between the taking out electrode and the bonding electrode is cut by an irradiation of laser light through the cover having light transparency.

3. The method for manufacturing a piezoelectric vibration device according to claim 2, wherein, in step (a), a narrowed width part, having a width narrower than a width of the taking out electrode, is formed in a plan view, between the taking out electrode and the bonding electrode so as to electrically couple the bonding electrode with the taking out electrode, and in step (f), the electrical coupling is cut by cutting the narrowed width part by the irradiation of laser light to the narrowed width part.

4. The method for manufacturing a piezoelectric vibration device according to claim 1 further comprising:
    forming the exciting electrode, the taking out electrode, and the bonding electrode in a plurality of numbers on a piezoelectric wafer having an area larger than an area of the piezoelectric substrate in a plan view so that each taking out electrode and each bonding electrode are electrically coupled, and each exciting electrode, each taking out electrode, and each bonding electrode correspond to each of the plurality of piezoelectric substrates;
    forming the first and second glass films in a plurality of numbers on a cover wafer having an area larger than an area of the cover in a plan view so that each first glass film and each second glass film correspond to each of the plurality of covers; and
    forming the through hole in a plurality of numbers on the cover wafer on which each first glass film and each second glass film are formed so that each through hole corresponds to each of the plurality of covers, wherein, in step (e), the piezoelectric wafer on which the exciting electrode, the taking out electrode, and the bonding electrode are formed and the cover wafer on which the through hole is formed, are overlapped so that a relative position of each of the plurality of piezoelectric substrates and each of the plurality of covers are aligned, and each first glass film and each second glass film that are formed on the cover wafer and each taking out electrode and each bonding electrode that are formed on the piezoelectric wafer, are bonded respectively, wherein in step (f), the electrical coupling between the taking electrode and the bonding electrode is cut in each of the plurality of piezoelectric substrates after step (e), and after step (f), an external electrode that is electrically coupled to the taking out electrode and extended to a second surface opposite the first surface of the cover from the taking out electrode through the through hole, is formed in a plurality of numbers on the cover wafer, and the cover wafer and the piezoelectric wafer are divided at every piezoelectric substrate.

* * * * *